United States Patent
Spencer et al.

(10) Patent No.: US 8,802,456 B2
(45) Date of Patent: *Aug. 12, 2014

(54) BETAVOLTAIC BATTERY WITH A SHALLOW JUNCTION AND A METHOD FOR MAKING SAME

(75) Inventors: Michael Spencer, Ithica, NY (US); Mvs Chandrashekhar, Columbia, SC (US)

(73) Assignee: Widetronix, Inc., Ithaca, NY (US)

( * ) Notice: Subject to any disclaimer, the term of this patent is extended or adjusted under 35 U.S.C. 154(b) by 250 days.

This patent is subject to a terminal disclaimer.

(21) Appl. No.: 13/372,734

(22) Filed: Feb. 14, 2012

(65) Prior Publication Data
US 2012/0149142 A1    Jun. 14, 2012

Related U.S. Application Data

(63) Continuation of application No. 13/195,484, filed on Aug. 1, 2011, now Pat. No. 8,153,453, and a continuation of application No. 12/888,521, filed on Sep. 23, 2010, now Pat. No. 8,017,412.

(60) Provisional application No. 61/250,504, filed on Oct. 10, 2009.

(51) Int. Cl.
*H01L 21/00* (2006.01)
*H01L 21/02* (2006.01)
*G21H 1/06* (2006.01)
*G21H 1/02* (2006.01)

(52) U.S. Cl.
CPC .... *H01L 21/02625* (2013.01); *H01L 21/02378* (2013.01); *H01L 21/02529* (2013.01); *H01L 21/02579* (2013.01); *G21H 1/06* (2013.01); *G21H 1/02* (2013.01)
USPC .......................... 438/19; 438/56; 257/E21.465

(58) Field of Classification Search
USPC ..................... 310/303; 136/253; 438/19, 56; 257/E21.12
See application file for complete search history.

(56) References Cited

U.S. PATENT DOCUMENTS

| | | | | |
|---|---|---|---|---|
| 3,510,094 | A  * | 5/1970 | Clark ............................. | 244/130 |
| 5,642,014 | A  * | 6/1997 | Hillenius ....................... | 310/303 |
| 5,859,484 | A  * | 1/1999 | Mannik et al. ................ | 310/303 |
| 6,479,919 | B1 * | 11/2002 | Aselage et al. ............... | 310/303 |
| 7,301,254 | B1 * | 11/2007 | Lal et al. ....................... | 310/309 |
| 7,663,288 | B2 * | 2/2010 | Chandrashekhar et al. .. | 310/303 |
| 7,939,986 | B2 * | 5/2011 | Chandrashekhar et al. .. | 310/303 |
| 2003/0070611 | A1* | 4/2003 | Nakamura et al. ............ | 117/109 |
| 2009/0026879 | A1* | 1/2009 | Prelas ............................ | 310/303 |
| 2010/0037937 | A1* | 2/2010 | Sater ............................. | 136/249 |
| 2011/0241144 | A1* | 10/2011 | Spencer et al. ............... | 257/429 |

* cited by examiner

*Primary Examiner* — Jarrett Stark
(74) *Attorney, Agent, or Firm* — MaxValueIP LLC

(57) ABSTRACT

This is a novel SiC betavoltaic device (as an example) which comprises one or more "ultra shallow" P+ N⁻ SiC junctions and a pillared or planar device surface (as an example). Junctions are deemed "ultra shallow", since the thin junction layer (which is proximal to the device's radioactive source) is only 300 nm to 5 nm thick (as an example). This is a betavoltaic device, made of ultra-shallow junctions, which allows such penetration of emitted lower energy electrons, thus, reducing or eliminating losses through electron-hole pair recombination at the surface.

20 Claims, 5 Drawing Sheets

BETAVOLTAIC BATTERY WITH A SHALLOW JUNCTION AND A METHOD FOR MAKING SAME

RELATED APPLICATIONS

This current application is a continuation of another U.S. application Ser. No. 13/195,484, filed Aug. 1, 2011 now U.S. Pat. No. 8,153,453, and it is also a continuation of another U.S. application Ser. No. 12/888,521, filed Sep. 23, 2010, now U.S. Pat. No. 8,017,412, issued on Sep. 13, 2011, with the same inventors, same assignee (Widetronix Inc.), which in turn claims priority to a prior provisional application, Ser. No. 61/250,504, filed 10 Oct. 2009. The current application claims priority to all the applications mentioned above, and it incorporates by reference all the teachings and specifications of the applications mentioned above.

BACKGROUND OF THE INVENTION

There are several technical constraints that must be considered when designing a low cost, manufacturable, high volume, high power density silicon carbide (SiC) betavoltaic device. First, consideration must be given to the energy profile of radioisotopes to be used, and the volume at which such material can be produced. For example, tritium is one of the several viable radioisotope candidates, since it can be produced in sufficient quantities to support high volume device manufacture, and its energy profile fits well with a range of power generation design parameters.

Secondly, in order to produce high power density in betavoltaics, a large device surface area is required. There are issued and pending betavoltaic patents that mention patterning methods for pillars, pores or other structures which yield such high surface area—patent application Ser. No. 11/509,323 is an example, and can be used as a reference for pillared betavoltaic device construction. These methods must be optimized appropriately in order to meet fabrication objectives, while controlling costs.

Thirdly, SiC has been shown to be the ideal material for betavoltaic devices, e.g. see reference patent application Ser. No. 11/509,323. However, SiC has unique processing, fabrication and design requirements which must be met in order to produce a workable device. For example, fabrication of SiC devices requires high temperature epitaxial processes. Because of such high temperature requirements, these epitaxial processes add an element of complexity and cost, not seen with processes relating to other semiconductors, such as Si, and must be taken into account accordingly, or fabrication techniques must be developed to remove such complex and costly processes entirely.

Fourthly, it is desirable to integrate betavoltaic devices directly with Silicon (Si)-based electronics, including, but not limited to, microprocessor and memory devices. Thus, there is a need for designs and fabrication processes which anticipate such integration.

A device which addresses or anticipates the aforementioned design considerations is disclosed herein. Methods for fabricating same are also disclosed.

SUMMARY OF THE INVENTION

This invention is a novel SiC betavoltaic device which comprises one or more "ultra shallow" P+ N− SiC junctions and a pillared or planar device surface. Junctions are deemed "ultra shallow", since the thin junction layer (which is proximal to the device's radioactive source) is only 300 nm to 5 nm thick.

In one embodiment of this invention, tritium is used as a fuel source. In other embodiments, radioisotopes (such as Nickel-63, promethium or phosphorus-33) may be used. For the remainder of this disclosure, and for purposes of illustration/example, tritium will be referenced as an exemplary fuel source. It should also be noted that, although SiC is described herein as the preferred semiconductor for this invention, other semiconductors, such as diamond and Group III-V nitrides, may also be used. For the remainder of this disclosure, and for purposes of illustration only, SiC will be referenced as an exemplary semiconductor. However, other similar semiconductors, dopants, and radioisotopes are also meant to be covered here.

Low energy beta sources, such as tritium, emit low energy beta-electrons that penetrate very shallow distances (as shallow as 5 nm) in semiconductors, including SiC, and can result in electron-hole pair creation near the surface of a semiconductor device rather than pair creation in a device's depletion region. By contrast, as a high energy electron penetrates a semiconductor device surface, such as a diode surface, it produces electron hole-pairs that can be collected at (by drift) and near (by diffusion) the depletion region of the device. If electron-hole pairs created by low energy beta-electrons are generated near the surface of a device, they will recombine there, due to interaction with surface states (i.e. defects occurring at the termination site of crystals and serving as sites for minority carrier loss), and will not be available for power generation.

Thus, with knowledge of a lower energy beta-electron's path length, it is desirable to create thin, or ultra-shallow, junctions, which enable even the lowest energy electrons to penetrate well into the depletion region. This invention is a betavoltaic device comprising ultra-shallow junctions which allow such penetration of emitted lower energy electrons, thus, reducing or eliminating losses through electron-hole pair recombination at the surface (see FIG. 1).

DETAILED EMBODIMENTS OF THE INVENTION

Figure 1:
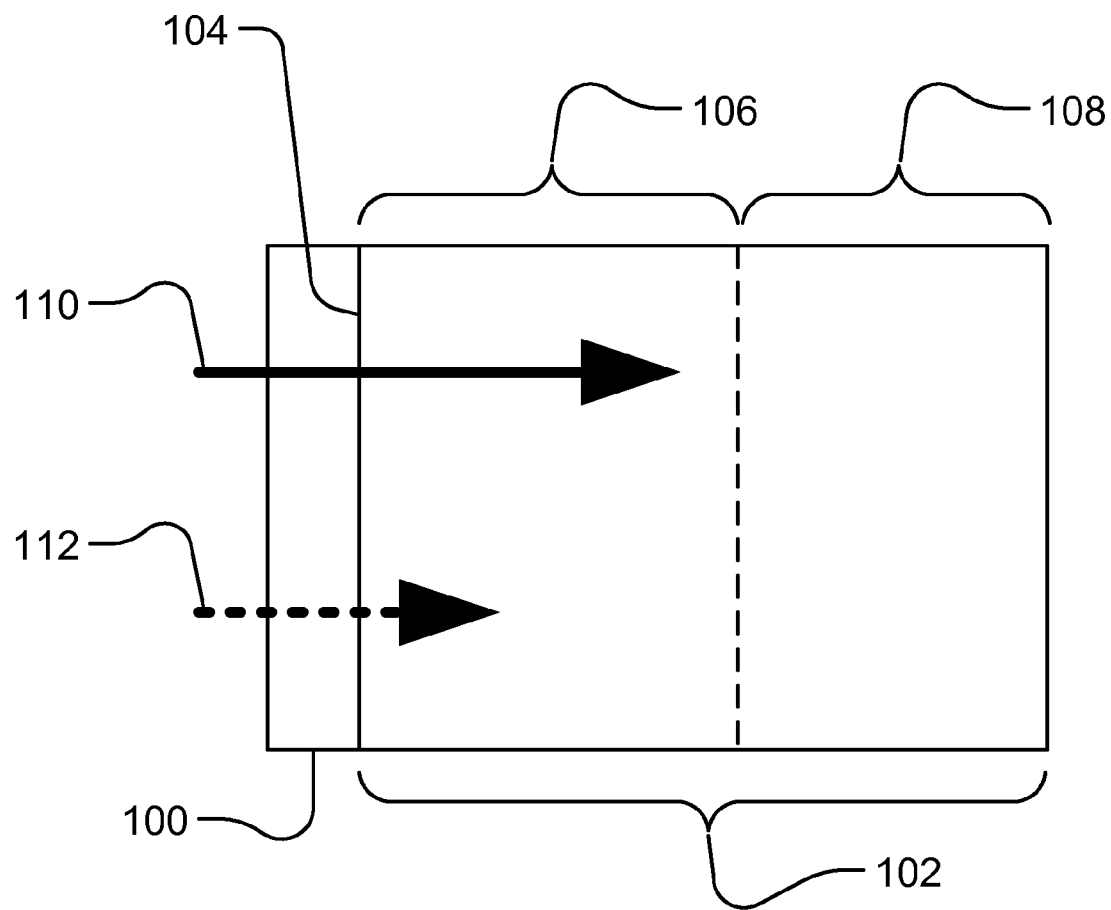
FIG. 1 shows the shallow P+N homojunction (interface at 104). Dashed arrow (112) indicates lower energy electrons penetrating into the device, while solid arrow (110) indicates higher energy electron penetration. Area 100 indicates P layer, while area 102 indicates N layer, with depletion layer separated at 106 region (versus 108 region).

Maximizing Charge Collection in SiC Betavoltaics—Influence of Junction Depth

To quantify the extent of the surface, it is necessary to know the penetration depth, or range, $R_B$ in nm, of the beta electron in the semiconductor, which is given as:

$$R_B(\mu m) = [4 \times E_0^{1.75}(\text{keV})/100]/\rho(\text{g/cm}^3), \quad (1)$$

where $E_0$ is the incident beta energy in keV, and $\rho$ is the density of the semiconductor in g/cm$^3$. The penetration depth is simply a function of the energy spectrum of the $\beta$-radiation, which is known. The spectrum, to first order, is given by $$f(E_0) = K\sqrt{E_0^2 + 2mc^2 E_0}(E_0\text{max}) - E_0)^2 \quad (2)$$

where f(E) is the energy distribution function, m the electronic mass, c the speed of light, and K a normalization constant, such that we have:

$$\int_0^{E_0(max)} f(E_0) dE_0 = 1 \quad (3)$$

The energy extends to a maximum, $E_0$(max), that typically lies at ~3 times the mean energy. For a given beta emitting isotope, a single $E_0$(max) completely specifies the spectrum, as eq. 2 indicates. There is a Coulombic penetration factor that modifies equation (2) above. This factor accounts for electrons being retarded by the Coulombic attraction from the nucleus, which skews the spectrum towards lower energies. Considering this factor, equation (2) becomes:

$$f(E_0) = KF(Z_D, E_0)\sqrt{E_0^2 + 2mc^2 E}(E_0(\text{max}) - E_0)^2 \quad (4)$$

where $F(Z_D, E_0)$, called the Fermi function, takes into account the Coulombic penetration effects. This function is tabulated in relevant semiconductor literature, and is related to the daughter nucleus atomic number, $Z_D$, and the energy of the emitted $\beta$ particle, $E_0$. It can be approximated by:

$$F(Z_D, E_0) = \frac{2\pi v}{1 - \exp(-2\pi v)} \quad (5)$$

where $$v = 1.16 \times 10^{-3} Z_D \Big/ \sqrt{\frac{E_0^2 + 2mc^2 E_0}{m^2 c^4 + E_0^2 + 2mc^2 E_0}}$$

The penetration depth is then estimated as described in equation (1). From (4), ~65% of the spectrum energy lies at or below the mean, 5.5 keV for Tritium, while >80% of the energy lies below E(max)/2, which is ~9 keV for Tritium.

Assuming that all the beta-generated electron-holes beyond the surface junction p-type layer are collected, while none of those generated in the surface junction layer are collected, we can estimate the charge collection as a function of energy, or as simply the fraction of the total path length $(R_B)$ that lies beyond the junction region $(X_j)$. This fraction at each energy in the beta spectrum is $(R_B - X_j)/R_B$.

Figure 4:
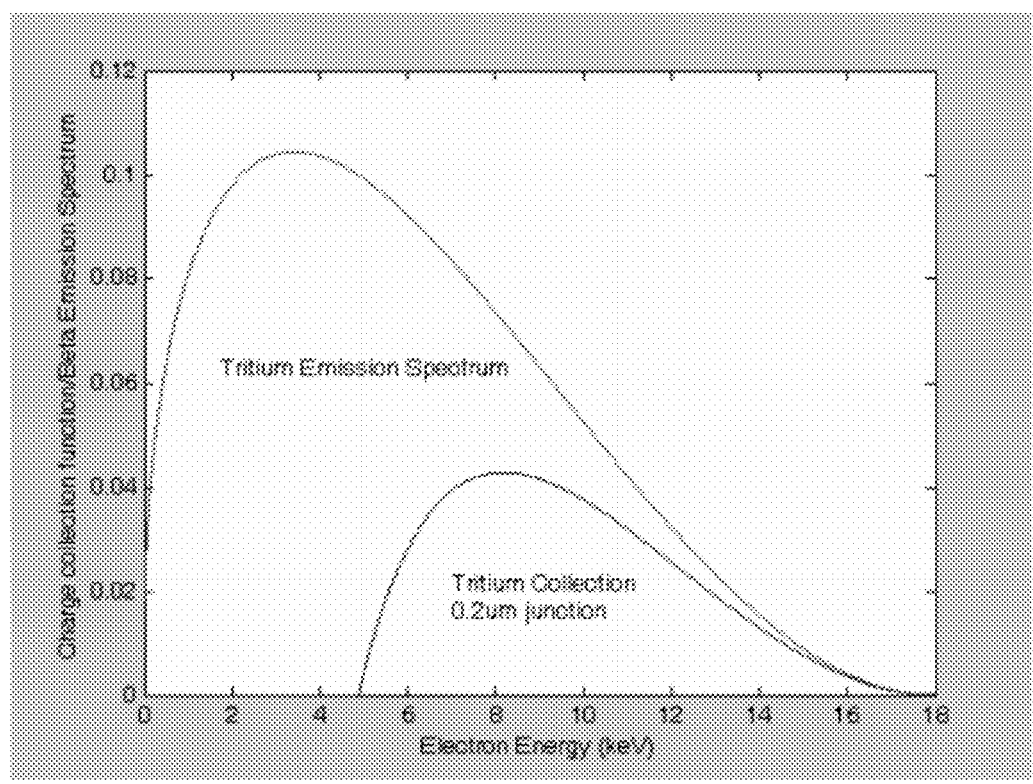
FIG. 4 shows the charge collection function/beta emission spectrum, versus electron energy (KeV), for Tritium emission spectrum (the upper curve) and Tritium collection (0.2 micron) junction (the lower curve).
Figure 5:
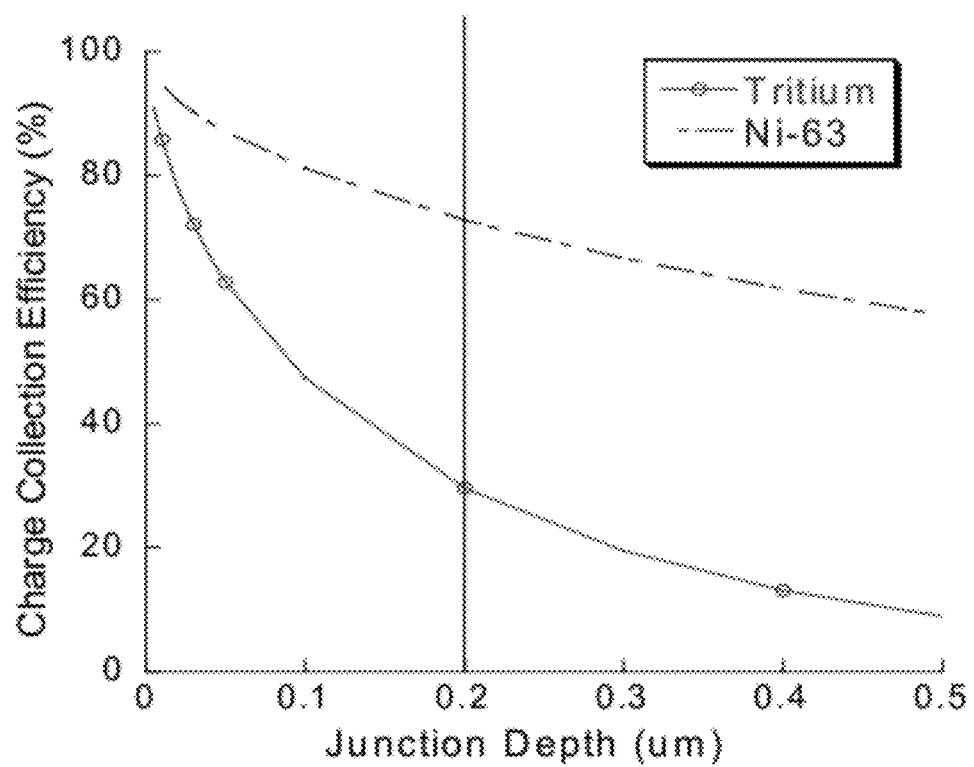
FIG. 5 shows the charge collection efficiency (in percentage) versus junction depth (in micron), for Tritium (denoted as the solid line with small circles) and for Ni-63 (denoted as the dashed line, with a higher efficiency, at a given depth).

Integrating the total charge collection function, we obtain the total charge collection efficiency. FIG. 4 illustrates the charge collection function of tritium, for a given junction depth of 0.2 μm. For reference, the incident beta spectrum is shown. Finally, FIG. 5 shows the total charge collection efficiency as a function of junction depth. It is clear that, for tritium, the cheapest and most practical isotope for higher powered cells, junctions <50 nm must be fabricated, to achieve higher charge collection efficiencies.

When ultra-shallow P+ N− junctions are utilized, the junction layer which is proximal to the device's radioactive source (the p-type surface junction layer mentioned above) is thin enough to permit source particle penetration deeper into the second junction layer (n-type layer) of the device. However, the p-type layer is also sufficiently thick to allow electron-hole pairs produced in the device to be collected/retained by internal electric fields of the junction, rather than being lost due to surface state interactions.

The limitation on the thickness of a thin P+ layer depends on the doping concentration of that layer. The thickness of the P+ layer must be sufficient to contain the internal electric fields of the P+ N− junction at zero bias and forward bias (under high energy electron irradiation). Another consequence of this requirement is that the surface depletion should be less than the junction depth, so that there is adequate conduction to make a contact to the p+ top region. The surface depletion is given as:

$$X_{d, surface} = \text{sqrt}(((2 * \in_{SiC}) * (V_{surface}))/(q * N_A)), \quad (6)$$

assuming that the surface barrier, $V_{surface}$ is 1V, typical for SiC. $\in_{SiC}$ is the dielectric constant of SiC, q is the electronic charge, while $N_A$ is the free hole concentration in the p+ SiC junction cap layer. This equation predicts that the P+ layer must be at least 300 nm, if a doping of $10^{18}$ cm$^{-3}$ is used, and can be reduced to 30 nm, if a doping in the P+ region of $10^{20}$ cm$^{-3}$ realized. Thus, if a doping of $10^{18}$ cm$^{-3}$ is used, the junction depth must be 0.3 μm or greater, which means that the charge collection efficiency will be less than 25%.

Based on the requirements for a tritium betavoltaic cell junction depth, described above, ultra-shallow junctions (below 30 nm), resulting from doping >$10^{20}$ cm$^{-3}$, must be realized, to achieve greater than 60% charge collection efficiency. Further reduction of the junction, due to higher doping densities, will allow charge collection efficiencies to approach 90%. With a sufficiently doped, thin p-layer, even lower energy electrons from a lower energy radioactive source can penetrate the device, so as to avoid surface recombination or interaction with surface states, and produce electron-hole pairs that are collected by internal junction fields (and are not lost).

In one embodiment of this invention, a maximum depth of particle absorption is 2 μm, and a doping level of $10^{14}$ cm$^{-3}$ is used for a thicker N− region, and a thin p+ region is formed (and doped at very high levels in accordance with the above discussions and formulations). In this embodiment, beta electrons from a tritium source will be captured in the internal fields of the junction formed by the N-region and the thin P+ region.

Doping described above, at levels >$10^{20}$ cm$^{-3}$, makes doping more complex, since the amount of p-dopants needed in SiC (aluminum and boron are examples of dopants) is substantial, requiring highly degenerate doping. Furthermore, typical commercial techniques used to fabricate SiC junctions, such as chemical vapor deposition (CVD) and ion-implantation, cannot easily and cost effectively meet the extreme/tight junction depth and doping tolerances for ultra-shallow junctions. Thus, new and effective methods must be created.

Figure 2:
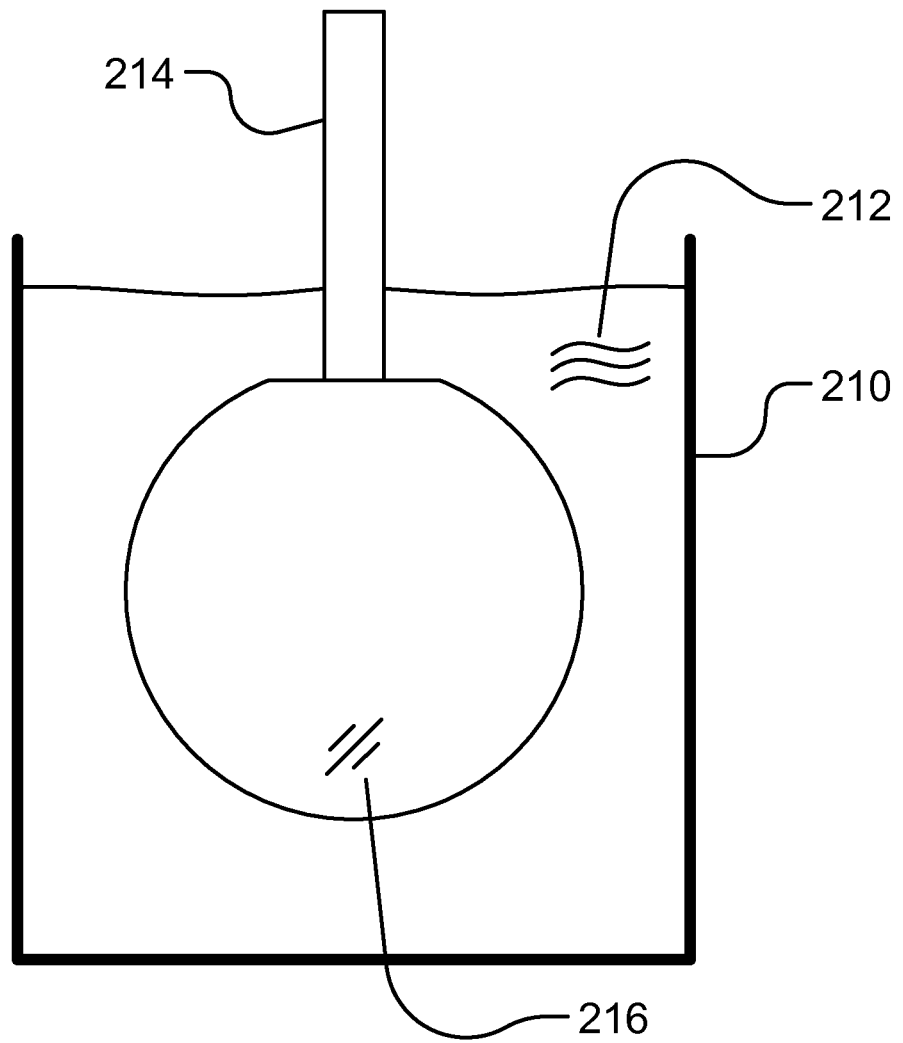
FIG. 2 shows the implementation of liquid-based (212) doping for thin P+ region, on substrate 216, in container or chamber 210, using a holder 214.

A highly-doped, thin P+ region may be formed, using a liquid based process (see FIG. 2). In one embodiment of this process a SiC wafer is dipped into a 400 degrees C. to 1200 degrees C. liquid, comprising Si, C, and Al. Upon removal of the wafer an extremely thin P+ layer of SiC with a thickness of 5 nm to 300 nm, and doped with Al at carrier concentrations of $10^{18}$ cm$^{-3}$ to greater than $10^{20}$ cm$^{-3}$, is formed.

In one embodiment of this invention, the concentrations of Si, C and Al are 94.5%, 0.5% and 5%, respectively. In alternative embodiments of this process, other concentrations of Si, C and Al may be used, with each element being no greater than 95%, 3% and 30%, respectively. In further embodiments, Ge may be added with Si, C and Al, with a concentration of no greater than 95%. This also applies to similar materials or methods, for any other dopants or semiconductors, such as group IV or compound III-V.

In another embodiment, such concentrations of Si, C and Al may be evaporated on the surface of the SiC. In further embodiments of this evaporation process, Si may be replaced with Ge, at concentrations referenced above for Si. The structure is heated to between 400 degrees C. and 1200 degrees C., and a thin layer of liquid forms on the SiC surface. This layer first dissolves a small amount of SiC, and then after cooling, the SiC is recrystallized with a significant amount of Al doping. Doping performed in this manner is conformal, and can be used for planar SiC or SiC with pillars.

This also applies to similar heating methods, such as pulsed, uniform, localized, ramping up and down, uniform ramping up, multiple exposures or single session, or operating at a lower temperature but at longer periods, to achieve the same effect on the doping and distribution of the dopants, or higher activation efficiencies for the dopants, or with sharper edges or doping profiles.

The doping methods described herein enable the manufacture of pillared or planar betavoltaic devices in a low cost batch process, which does not require high temperature SiC epitaxial processes such as chemical vapor deposition. Since high temperature gas phase epitaxial processes are eliminated, direct manufacture of betavoltaic devices from substrates is now possible, and fabrication processes, including Si-based processes, requiring temperatures lower than those relating to SiC epitaxy, can be utilized, all of which results in substantial manufacturing cost savings.

Figure 3:
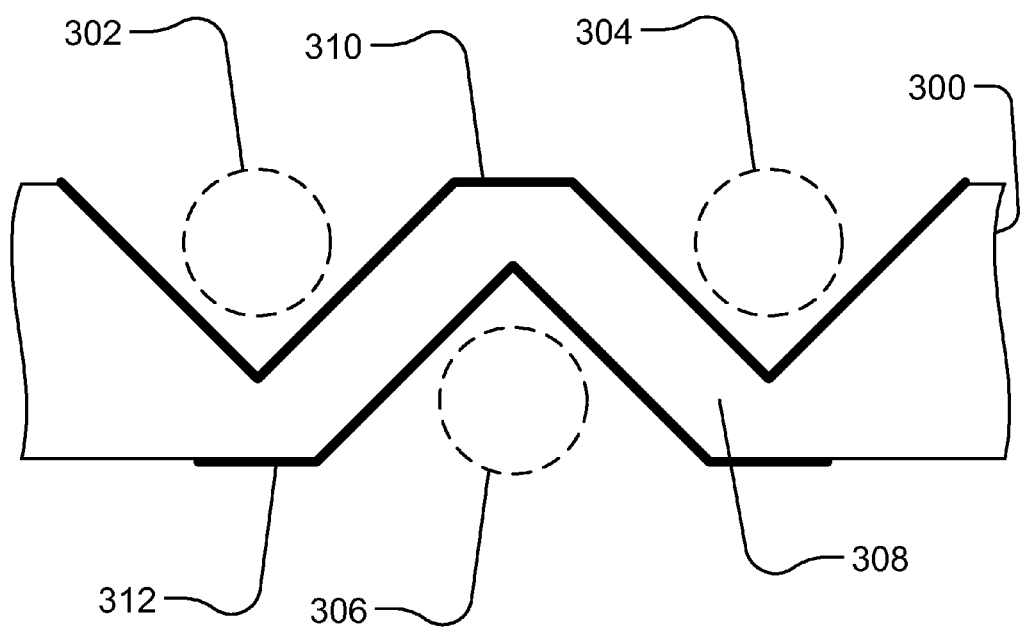
FIG. 3 shows betavoltaic device implemented using both sides of a full substrate (300). One or more V-Grooves (302, 304, and 306) are on each side of the substrate (300), with a thin p-layer (310 and 312). Areas (narrow lines) 310 and 312 indicate P-layer, and area 308 indicates N-layer.

FIG. 3 shows betavoltaic structures that can be fabricated, when the constraints of high temperature epitaxy are removed. Due to its lower temperature requirements, this technology can be directly integrated with Si-based processes, such as "Smartcut" processes, which enable betavoltaic device integration with Si-based electronics. Other Si-based processes may also be used with the methods described here.

More details are described here in the following figures:
FIG. 1 shows the shallow P+N homojunction (interface at 104). Dashed arrow (112) indicates lower energy electrons penetrating into the device, while solid arrow (110) indicates higher energy electron penetration. Area 100 indicates P layer, while area 102 indicates N layer, with depletion layer separated at 106 region (versus 108 region).

FIG. 2 shows the implementation of liquid-based (212) doping for thin P+ region, on substrate 216, in container or chamber 210, using a holder 214.

FIG. 3 shows betavoltaic device implemented using both sides of a full substrate (300). One or more V-Grooves (302, 304, and 306) are on each side of the substrate (300), with a thin p-layer (310 and 312). Areas (narrow lines) 310 and 312 indicate P-layer, and area 308 indicates N-layer.

FIG. 4 shows the charge collection function/beta emission spectrum, versus electron energy (KeV), for Tritium emission spectrum (the upper curve) and Tritium collection (0.2 micron) junction (the lower curve).

FIG. 5 shows the charge collection efficiency (in percentage) versus junction depth (in micron), for Tritium (denoted as the solid line with small circles) and for Ni-63 (denoted as the dashed line, with a higher efficiency, at a given depth).

In one embodiment of this invention, the growth rate of a P-doped layer can be calibrated for a few growth samples, such that the thickness of the P region is measured, e.g. by CV or SIMS measurements, to find the junction between P and N types, and to calculate the obtained average growth rate (R). Then, in a similar growth environment, the growth is controlled by time (t), for a thickness of L, according to:

$$L = R*t \qquad (7)$$

Wherein R is in micron/hour, t is in hour (or converted to seconds), and L is in micron.

Any variations of the teachings above are also meant to be covered and protected by this current application.

The invention claimed is:

1. A semiconductor processing method, said method comprising:
   etching or removing semiconductor material from one or more regions of a semiconductor substrate at an angle so that resulting surface of said semiconductor substrate is not flat, compared to original surface of said semiconductor substrate, and said resulting surface of said semiconductor substrate has one or more dimples, indentations, or pits;
   wherein said semiconductor substrate is an N-type doped semiconductor;
   adding elements Si and C to said semiconductor substrate from a hot liquid;
   growing P-type doped semiconductor layer on said semiconductor substrate; and
   attaching said semiconductor substrate to a piece of radioisotope material.

2. A semiconductor processing method, said method comprising:
   etching or removing semiconductor material from one or more regions of a semiconductor substrate at an angle so that resulting surface of said semiconductor substrate is not flat, compared to original surface of said semiconductor substrate, and said resulting surface of said semiconductor substrate has one or more dimples, indentations, or pits;
   wherein said semiconductor substrate is a P-type doped semiconductor;
   adding elements Si and C to said semiconductor substrate from a hot liquid;
   growing N-type doped semiconductor layer on said semiconductor substrate; and
   attaching said semiconductor substrate to a piece of radioisotope material.

3. The semiconductor processing method as recited in claim 1, wherein said semiconductor substrate is a lightly-doped material.

4. The semiconductor processing method as recited in claim 1, wherein said radioisotope material is tritium.

5. The semiconductor processing method as recited in claim 1, wherein said radioisotope material is Ni-63.

6. The semiconductor processing method as recited in claim 1, wherein said semiconductor substrate is from group IV elements.

7. The semiconductor processing method as recited in claim 1, wherein said semiconductor substrate is from group III-V elements.

8. The semiconductor processing method as recited in claim 1, wherein said semiconductor substrate is SiC.

9. The semiconductor processing method as recited in claim 1, wherein temperature of said hot liquid is between 400 degrees C. to 1200 degrees C.

10. The semiconductor processing method as recited in claim 1, wherein doping of said semiconductor substrate is smaller than doping of said P-type doped semiconductor layer deposited on said semiconductor substrate.

11. The semiconductor processing method as recited in claim 1, wherein said P-type doped semiconductor layer deposited on said semiconductor substrate is highly doped.

12. The semiconductor processing method as recited in claim 1, wherein doping of said P-type doped semiconductor layer deposited on said semiconductor substrate is highly degenerate.

13. The semiconductor processing method as recited in claim 1, wherein thickness of said P-type doped semiconductor layer deposited on said semiconductor substrate is in range of 5 nm to 300 nm.

14. The semiconductor processing method as recited in claim 1, wherein said P-type doped semiconductor layer deposited on said semiconductor substrate is doped with Al.

15. The semiconductor processing method as recited in claim 1, wherein said P-type doped semiconductor layer deposited on said semiconductor substrate is doped at carrier concentrations of between a range of $10^{18}$ cm$^{-3}$ to a few times $10^{20}$ cm$^{-3}$.

16. The semiconductor processing method as recited in claim 1, wherein relative concentration of said elements Si and C in said hot liquid are 94.5% and 0.5%, respectively, with 5% relative concentration for other elements.

17. The semiconductor processing method as recited in claim 1, said semiconductor processing method further comprises: using aluminum or boron as a dopant.

18. The semiconductor processing method as recited in claim 1, said semiconductor processing method further comprises: adding Ge into said hot liquid.

19. The semiconductor processing method as recited in claim 1, wherein said semiconductor substrate is based on planar SiC.

20. The semiconductor processing method as recited in claim 1, wherein said semiconductor substrate is based on SiC with pillars.

* * * * *